(12) United States Patent
Woolsey

(10) Patent No.: US 7,081,587 B1
(45) Date of Patent: Jul. 25, 2006

(54) SELF-SEALING EMC DOOR FOR REMOVABLE UNITS REQUIRING A CONTINUOUS GROUNDING BARRIER

(75) Inventor: Terrill L. Woolsey, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/120,840

(22) Filed: May 2, 2005

(51) Int. Cl.
*H05K 9/00* (2006.01)

(52) U.S. Cl. ............... 174/35 GC; 174/135; 174/35 R; 361/692; 361/800; 361/816

(58) Field of Classification Search ........... 174/35 GC, 174/135, 35 R; 361/692, 800, 816
See application file for complete search history.

(56) References Cited

U.S. PATENT DOCUMENTS

| | | | |
|---|---|---|---|
| 4,275,368 A | 6/1981 | Wimmer | 333/167 |
| 5,957,465 A | 9/1999 | Gonsalves et al. | 277/637 |
| 6,297,446 B1 | 10/2001 | Cherniski et al. | 174/35 R |
| 6,307,538 B1 | 10/2001 | Bacon | 345/163 |
| 6,362,416 B1 | 3/2002 | Denney et al. | 174/35 R |
| 6,403,878 B1 | 6/2002 | Neuwardt et al. | 174/35 GC |
| 6,478,170 B1 | 11/2002 | Zeidan et al. | 211/183 |
| 6,483,720 B1 | 11/2002 | Buffet et al. | 361/818 |
| 6,507,495 B1 | 1/2003 | Hailey et al. | 361/748 |
| 6,660,932 B1 | 12/2003 | Barringer et al. | 174/35 R |
| 6,765,806 B1 | 7/2004 | Caldwell | 361/816 |
| 6,775,131 B1 | 8/2004 | Hanson | 361/685 |
| 6,794,571 B1 | 9/2004 | Barringer et al. | 174/35 GC |
| 6,813,672 B1 | 11/2004 | Kamran et al. | 710/305 |
| 6,822,877 B1 | 11/2004 | Chen | 361/801 |

*Primary Examiner*—Jinhee Lee
(74) *Attorney, Agent, or Firm*—Ortiz & Lopez, PLLC

(57) ABSTRACT

A self-sealing apparatus for containing electrical energy associated with electrical components. The apparatus includes one or more removable devices maintained by a housing. Each of the removable devices contains electrical components therein and is separated from at least one other removable device by a clearance gap formed therebetween. A self-sealing barrier can be formed from the clearance gap, wherein the clearance gap surrounds the removable device in order to contain electrical energy associated with the electrical components when the electrical components are maintained within the removable device or extracted or inserted from or into the removable device.

14 Claims, 8 Drawing Sheets

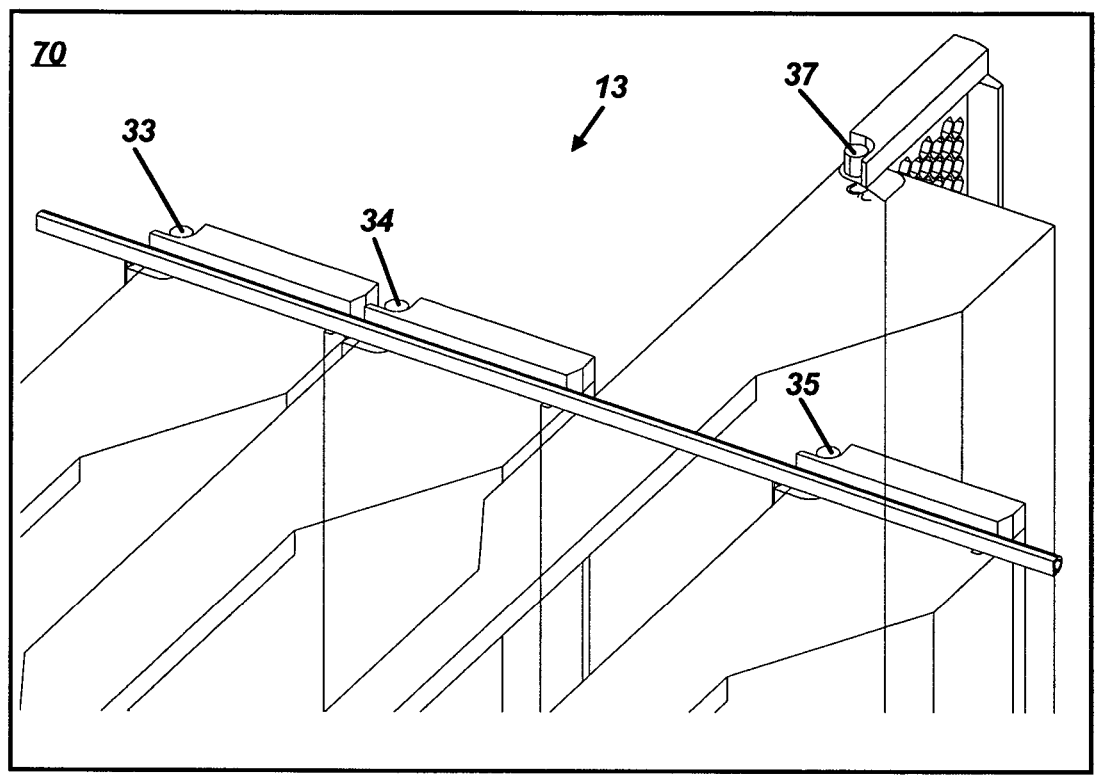
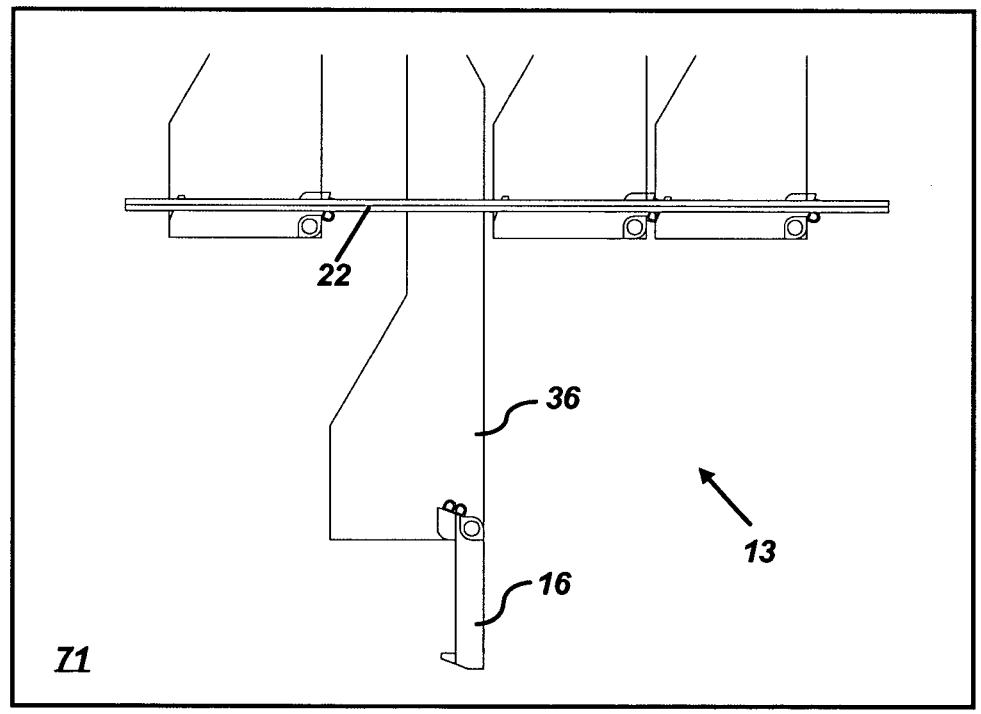
FIG. 7

SELF-SEALING EMC DOOR FOR REMOVABLE UNITS REQUIRING A CONTINUOUS GROUNDING BARRIER

TECHNICAL FIELD

Embodiments are generally related to EMC (Electromagnetic Compatibility) and RFI (Radio Frequency Interference) components and devices. Embodiments are also related to EMC sealing devices for an electrical enclosure.

BACKGROUND OF THE INVENTION

The past several decades have witnessed the development of ever smaller electrical circuit components at the chip level. In order to take fullest advantage of achievements in electrical circuit miniaturization; however, one must package the resultant printed circuit cards containing these chips in an efficient manner. Clearly, the packaging of printed circuit cards in tight spaces is a direct logical extension of increasing chip level circuit densities. It should also be noted that the tight packaging of integrated circuit chips on printed circuit cards and the correspondingly dense packaging of the printed circuit cards is a design goal that is carried out for more than just the convenience of compactness. Compactness provides shorter distances between circuit components which, in turn, serve the very desirable goal of being able to operate the circuits effectively at higher frequencies, thus increasing the speed of numerous different forms of electrical systems, including but not limited to data processing systems.

Moreover, mainly for reasons associated with long-term system operation and reliability, it is likewise very desirable to be able to easily insert and remove these printed circuit cards even when they are disposed in very tight spaces. The insertion and removal operations are also provided as an important part of a "hot-pluggability" function which is very desirable for "on the fly" repairs, replacements, maintenance and upgrades. Accordingly, to whatever extent possible, packaging designs should be: economical to produce; function smoothly, require little or no maintenance; be producible from inexpensive, readily available materials; and be reliably operable over a large number of insertion and removal operation cycles.

Yet one other concern arises in electrical systems as circuit feature size shrinks, operating frequencies increase and packaging densities grow larger, namely, the generation of electromagnetic interference (EMI). Electronic circuit packaging designs should thus also be compatible with structures and configurations that are employed to prevent the leakage of electromagnetic interference.

Packaging designs should also include structures, which actually contribute positively to the containment of electromagnetic interference. There is an ever-increasing problem of electromagnetic interference caused by such devices. Virtually every electronic device, intentionally or not, emits some form of electromagnetic radiation. While this condition could be tolerated when few devices existed, the increasing number of electronic devices has made the problem more acute. The problem has been exacerbated by the "improvement" in semiconductor devices, which allows them to operate at higher speeds, generally causing emission in the higher frequency bands where interference is more likely to occur.

Successful minimization of the interference problem, sometimes referred to as "electromagnetic compatibility" or "EMC", generally requires that emissions from a given device be reduced by shielding and other means, and shielding be employed to reduce the sensitivity of a device to fields from other devices. Since shielding helps to reduce sensitivity to external fields as well as reduce emissions from the device, it is a common approach to a solution of the problem.

In the typical enclosure for a computer, for example, a number of electronic components are mounted therein. Such components include, for example, a central processing unit (CPU), a microprocessor, random access memory (RAM), read only memory (ROM) and other computer chips and electronic devices. Such electronic components may emit electromagnetic radiation during their operations. Data-processing devices, such as computers are typically manufactured with expansion slots to allow peripheral devices to be added to the computer or system. In such configurations, much of the electromagnetic radiation can leak out through the expansion slots to potentially interfere with other electronic components.

Typically, a number of cover plates are attached to a rear panel and block the expansion slots thereon. However, as the internal circuitry of computers has advanced, the cover plates can be inadequate to block the electromagnetic radiation. The inadequacy of the cover plates is believed to be due to gaps between the cover plates and the computer enclosure. In order to overcome such drawbacks, it is believed that a solution involves the implementation of a removable device containing EMC/RFI energy that can be contained by a continuous perimeter grounding seal or barrier. Such features are described in greater detail herein.

BRIEF SUMMARY

The following summary of the invention is provided to facilitate an understanding of some of the innovative features unique to the present invention and is not intended to be a full description. A full appreciation of the various aspects of the invention can be gained by taking the entire specification, claims, drawings and abstract as a whole.

It is therefore one aspect of the present invention to provide for an apparatus for containing EMC and/or RFI energy associated with electrical components.

It is another aspect of the present invention to provide for an improved EMC sealing device for an electronics enclosure.

It is a further aspect of the present invention to provide for a self-sealing EMC door for removable units requiring a continuous grounding barrier.

The above and other aspects of the invention can be achieved as will now be briefly described. A self-sealing apparatus for containing electrical energy associated with electrical components is disclosed, which includes one or more removable devices maintained by a housing. Each of the removable devices contains electrical components therein and is separated from at least one other removable device by a clearance gap formed therebetween. A self-sealing barrier can be formed from the clearance gap, wherein the clearance gap surrounds the removable device in order to contain electrical energy associated with the electrical components when the electrical components are maintained within the removable device or extracted or inserted from or into the removable device.

A door can be associated with each removable device, wherein the door comprises a plurality of inlet holes, which allows air to flow therethrough and reduce heating associated with the electrical components. Additionally, a handle can be with removable device, wherein the handle provides leverage for opening the self-sealing barrier about the door.

A first gasket can be formed horizontally across the housing, while a second gasket can be formed vertically along a pivot edge of the door, such that when the door is closed the door compresses the first and second gaskets against another removable device or against the housing in order to provide the self-sealing barrier thereof.

Each inlet hole among the plurality of inlet holes comprises a length thereof that functions as wave-guides that absorb the electrical energy coming into contact with an inner surface of each inlet hole. The self-sealing barrier (i.e., a seal) can be configured as a conductive seal formed from a conductive material with a low impedance to electrical current. The self-sealing barrier can also be configured as a continuous perimeter grounding seal surrounding the removable device. The housing can be configured as a chassis cage. The electrical energy associated with the electrical components typically comprises EMC and/or RFI energy.

The apparatus disclosed herein is thus directed toward a removable device containing EMC/RFI energy that radiates if not contained by a continuous perimeter grounding seal or barrier. To avoid the device clearance gaps from becoming antennas, the gaps must be sealed. Additional features include airflow passage and handle leverage extraction.

The removable device can be implemented, for example, in the context of a Customer Removable Unit (CRU) of a Data Storage Tray. The device is extractable by using the handle described above as a leverage to open the perimeter ground seals around the device door. The handle and door then act as a pulling feature to extract the device. Insertion is preformed in the reverse order. The device can contain Electronic items like disk drives, power supplies, circuit boards, and etc. each having EMC/RFI characteristics. The number of devices can range from one to as many as the chassis cage can contain.

BRIEF DESCRIPTION OF THE DRAWINGS

The accompanying figures, in which like reference numerals refer to identical or functionally similar elements throughout the separate views and which are incorporated in and form part of the specification, further illustrate embodiments of the present invention.

FIG. 7 illustrates a pictorial diagram depicting EMC/RFI cage seals in accordance with a preferred embodiment.

DETAILED DESCRIPTION OF THE INVENTION

The particular values and configurations discussed in these non-limiting examples can be varied and are cited merely to illustrate embodiments of the present invention and are not intended to limit the scope thereof.

The embodiments disclosed herein describe a removable device containing EMC/RFI (Electromagnetic Compatibility/Radio Frequency Interference) energy that can radiate if not contained by a continuous perimeter grounding seal or barrier. To avoid the device clearance gaps from becoming antennas, the gaps are sealed. Additional features include airflow passage and handle leverage extraction. Note that as utilized herein, the term Electromagnetic Compatibility (EMC) generally refers to an electrical system's ability to perform its specified functions in the presence of electrical noise generated either internally or externally by other systems. The goal of EMC is to minimize the influence of electrical noise. Radio Frequency Interference (RFI), on the other hand, is considered part of the Electromagnetic Interference (EMI) spectrum, with interference signals being within the radio frequency (RF) range. Electromagnetic Interference (EMI) generally refers to the electromagnetic energy from sources external or internal to electrical or electronic equipment that adversely affects equipment by creating undesirable responses (degraded performance or malfunctions).

The removable device can be implemented in the context of a Customer Removable Unit (CRU) of a Data Storage Tray. The device is extractable utilizing a handle as a leverage to open the perimeter ground seals around the device door. The handle and door then act as a pulling feature to extract the device. Insertion is preformed in the reverse order. The device can contain electronic items such as, for example, disk drives, power supplies, circuit boards, and the like, each having EMC/RFI characteristics. The number of devices can range from one to as many as the chassis cage can contain, depending on design considerations.

Figure 1:
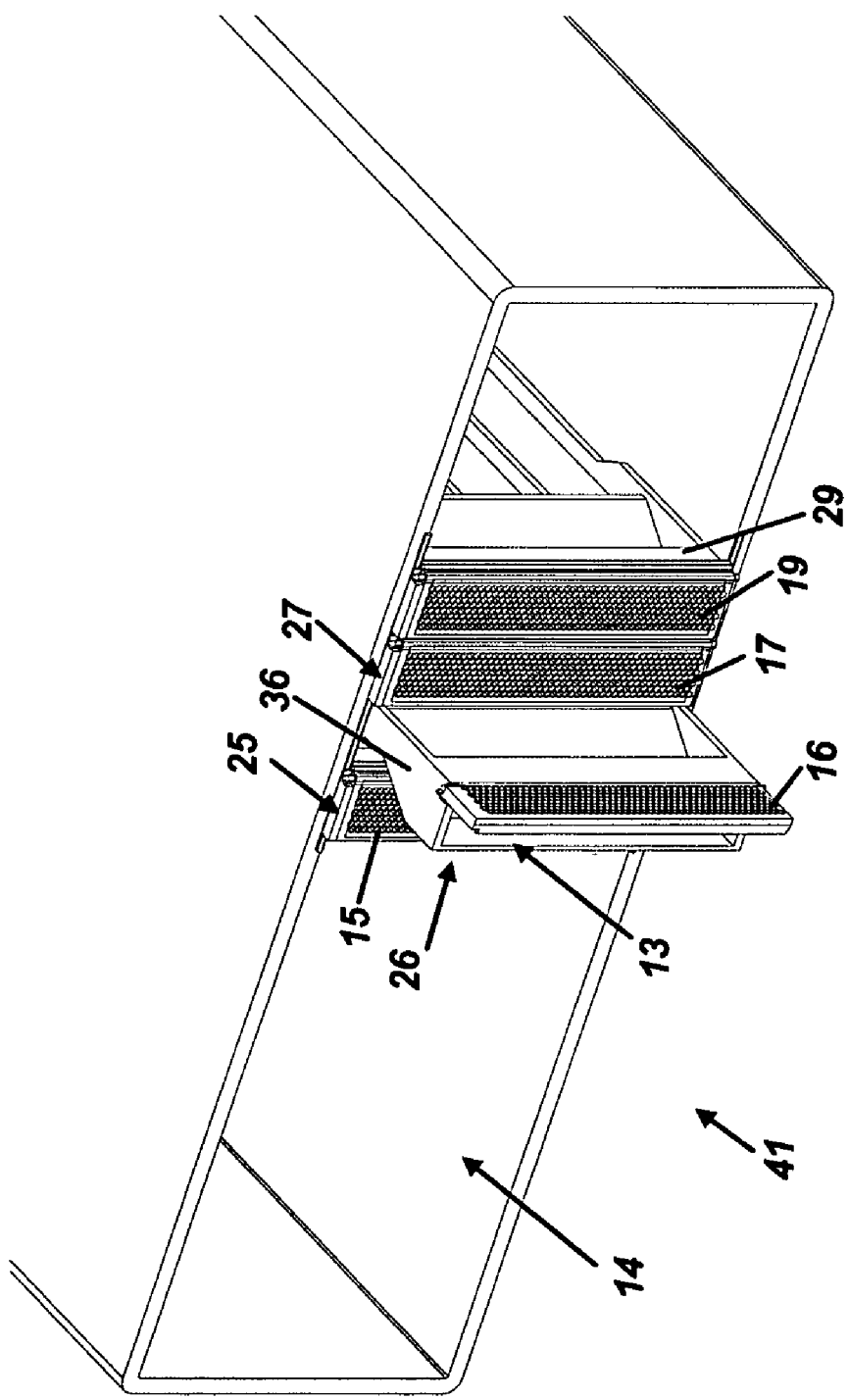
FIG. 1 illustrates a pictorial diagram depicting a set of four removable devices inserted in a chassis cage, in accordance with a preferred embodiment.

FIG. 1 illustrates a pictorial diagram depicting a system 41 that includes a group 13 of four removable devices 25, 26, 27, 29 inserted in a chassis cage 14, in accordance with a preferred embodiment. Each item or device 25, 26, 27, 29 of system 41 respectively include a door 15, 16, 17, 19. The basic concept of system 41 includes the chassis cage 14 partially or completely filled with removable devices 25, 26, 27, 29 with EMC/RFI energy. Door 16, for example, provides an EMC/RFI seal, along with an airflow passage and an extraction handle. Similar features can be incorporated into doors 15, 17 and 19.

Figure 2:
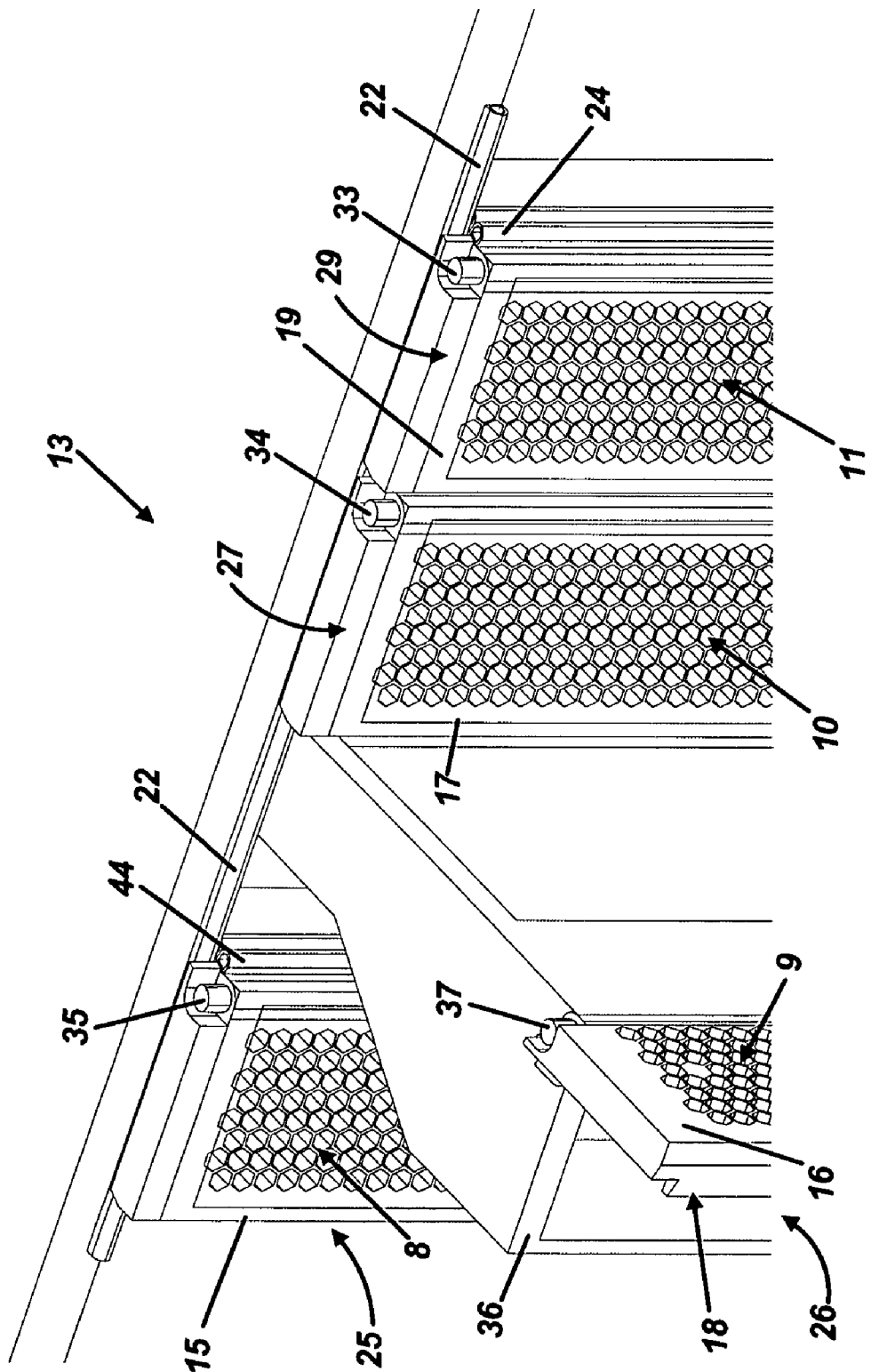
FIG. 2 illustrates a pictorial diagram illustrating four removable devices in accordance with a preferred embodiment.

FIG. 2 illustrates a pictorial diagram illustrating in greater detail the four removable devices 25, 26, 27, 29 depicted in FIG. 1, in accordance with a preferred embodiment. Note that in FIGS. 1–8 herein, identical or similar parts or elements are generally indicated by identical reference numerals. Each removable device 25, 26, 27, 29 comes equipped with a door with an extraction example. For example, as depicted in FIG. 2, removable device 26 includes a door 16 with an extraction handle 18. Each removable device 25, 26, 27, 29 comes equipped with perimeter gaskets. For example, perimeter gaskets 22 and 24 are depicted in FIG. 2. In the configuration of FIG. 2, perimeter gasket 24 is associated with removable device 29, which in turn is associated with door 19. Such perimeter gaskets promote RFI sealing.

Each door 15, 16, 17, 19 also comes equipped with airflow inlets to promote the flow of air for cooling each respective item or device 25, 26, 27, 29. For example, as depicted in FIG. 2, door 15 is configured to incorporate a plurality of airflow inlets 8, while door 16 incorporates a plurality of airflow inlets 9. Similarly, door 17 incorporates a plurality of airflow inlets 10 and door 19 incorporates a plurality of airflow inlets 11.

As further indicated in FIG. 2, removable device 26 is associated with a removable portion 36 that provides a mounting for the electronic items thereof that generate EMC/RFI energy. These items can range from disk drives, power supplies, circuit boards and any other interface item that may generate EMC/RFI energy. The mounting may also provide for electrical interconnection with other items in the chassis or cage.

Figure 3:
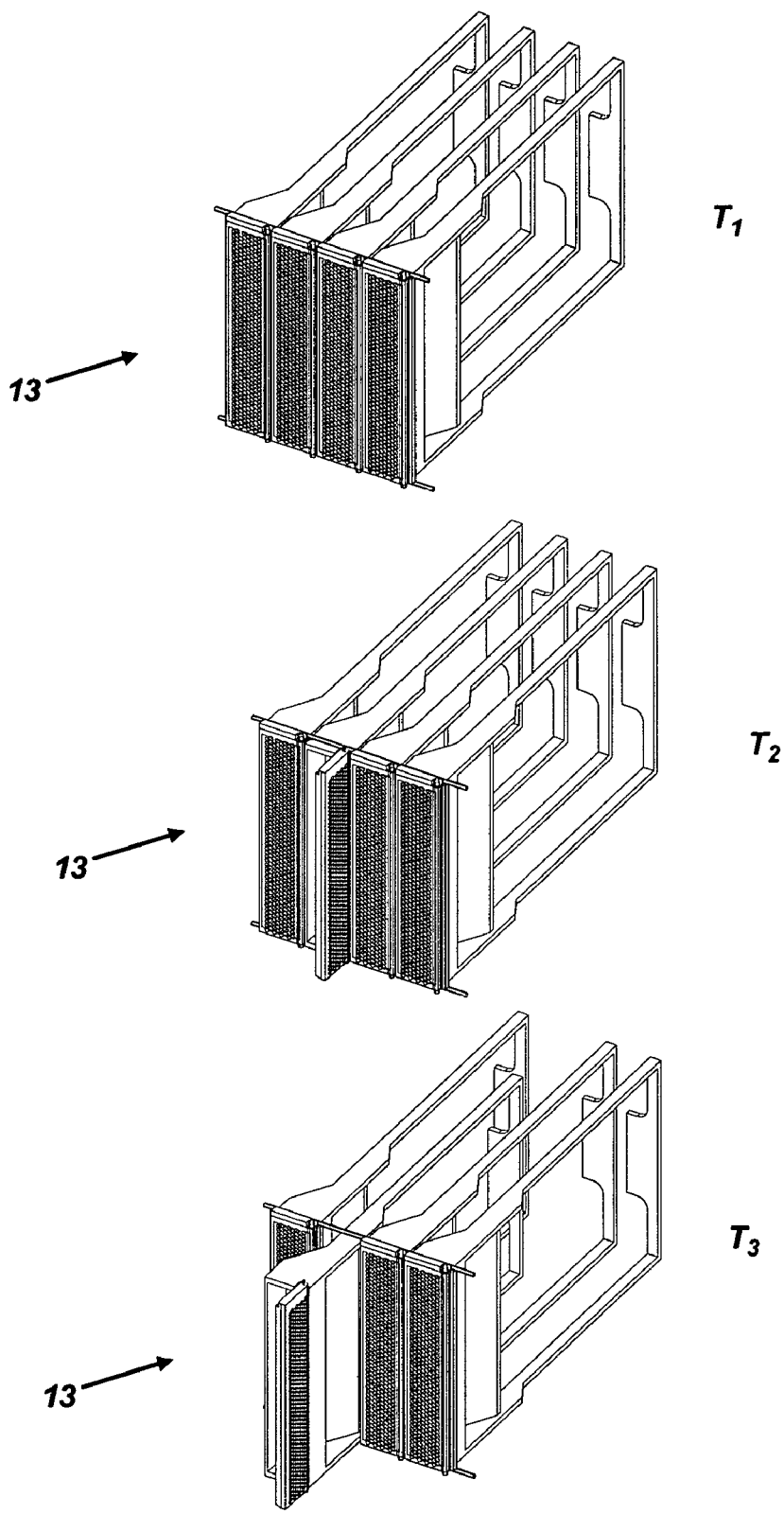
FIG. 3 illustrates a pictorial diagram depicting an extraction sequence in accordance with a preferred embodiment.

FIG. 3 illustrates a pictorial diagram depicting an extraction sequence in accordance with a preferred embodiment. In general, extraction of the removable portion 36 of removable device 26 begins by opening the door 16 with some type of handle 18. This releases the EMC/RFI gaskets thereof and allows the removable portion 36 to clear other devices. Pulling on the handle 18 removes the device from the chassis cage 14, as depicted in FIG. 3. A sequence of events at time $T_1$, $T_2$ and $T_3$ is generally depicted in FIG. 3.

Figure 4:
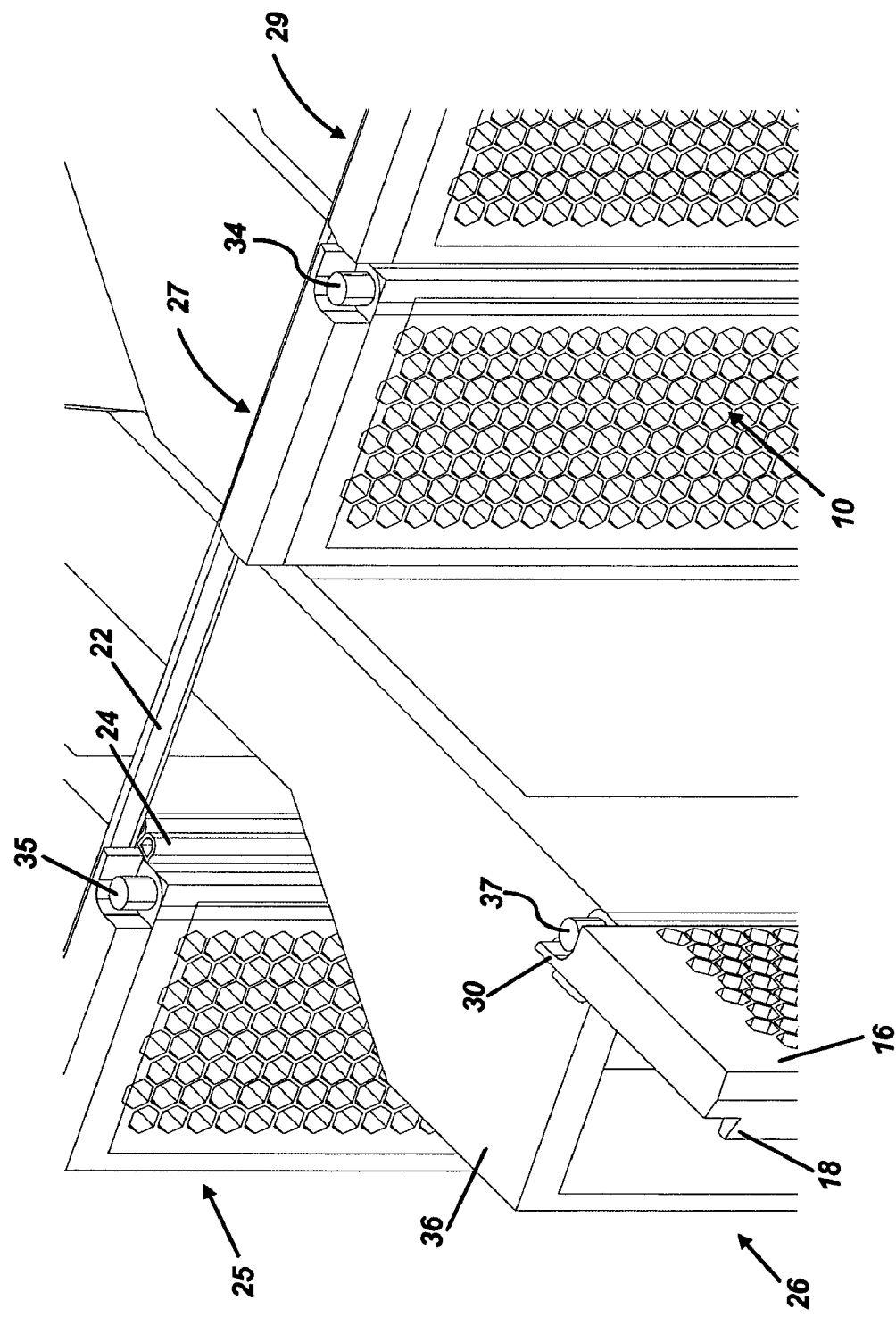
FIG. 4 illustrates a pictorial diagram illustrating a configuration of EMC/RFI gaskets in accordance with a preferred embodiment.

FIG. 4 illustrates a pictorial diagram illustrating a configuration of EMC/RFI gaskets in accordance with a preferred embodiment. In the example depicted in FIG. 4, the door 16 can open on a pivot pin 37 allowing it to rotate to approximately 90-degrees from the sealed position. In the sealed position the door 16 is surrounded on all edges with electrically conductive gaskets providing ground contact with the adjacent devices and the chassis cage 14. The horizontal gasket 22 is attached to the chassis cage 14 and seals the top and bottom of all doors 16 of the devices continuously.

Figure 5:
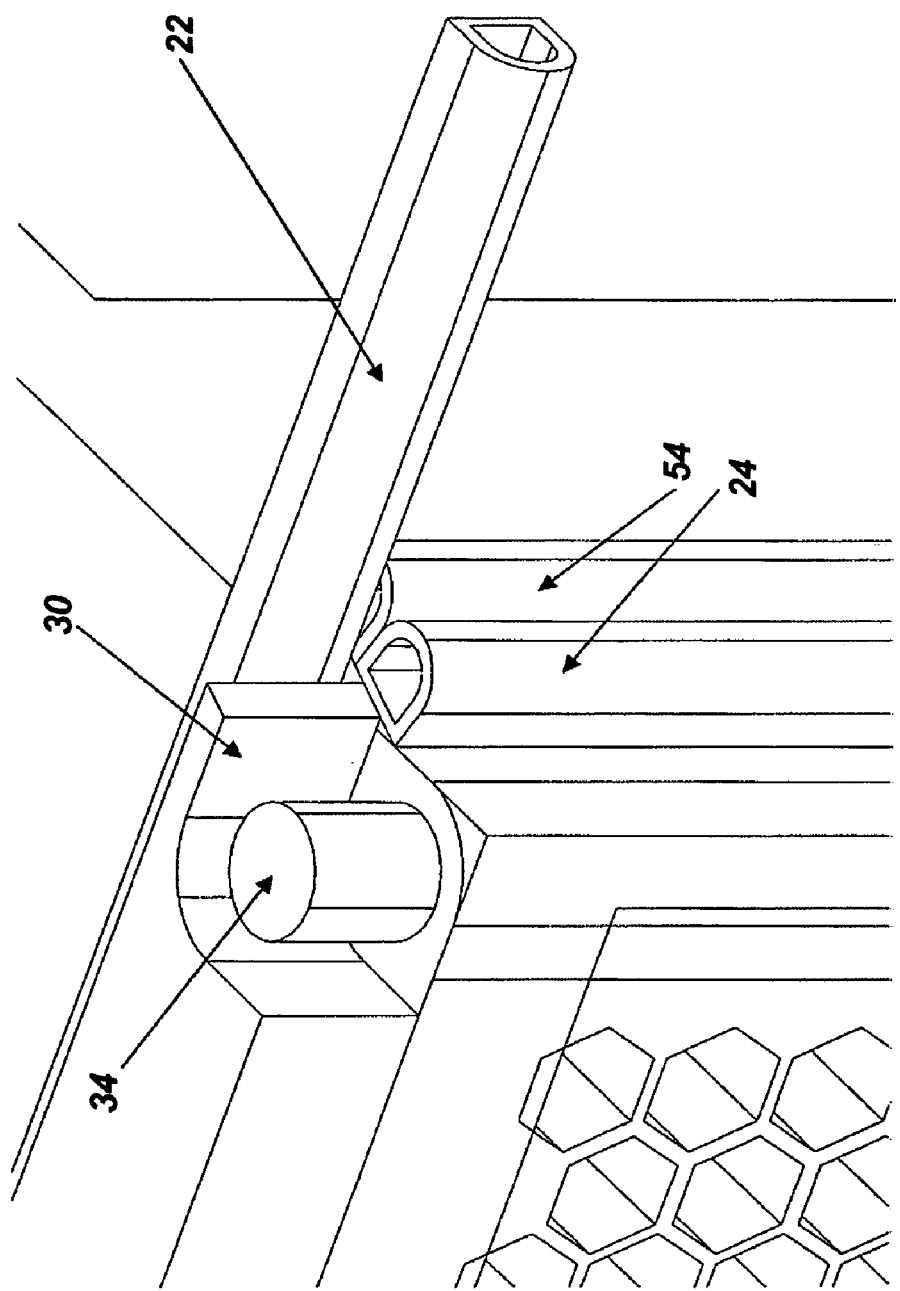
FIG. 5 illustrates a pictorial diagram depicting the intersection of EMC/RFI seals in accordance with a preferred embodiment.

FIG. 5 illustrates a pictorial diagram depicting the intersection of EMC/RFI seals in accordance with a preferred embodiment. The door 16 has features for leveraging the removable portion 36 for insertion and extraction. This feature can take on many shapes to accomplish the cam action 30 needed for insertion and extraction. The leverage may be needed for connecting or disconnecting the device from other items in the chassis or cage 14. The door 16 may or may not contain an attached handle 18 used for opening and extraction of the device 36. The handle 18 can be as simple as a knob or as complex as a compound surface used for styling. The main function of the handle 18 is to rotate the door 16 about the pivot 34 and assist in extraction and insertion.

Figure 6:
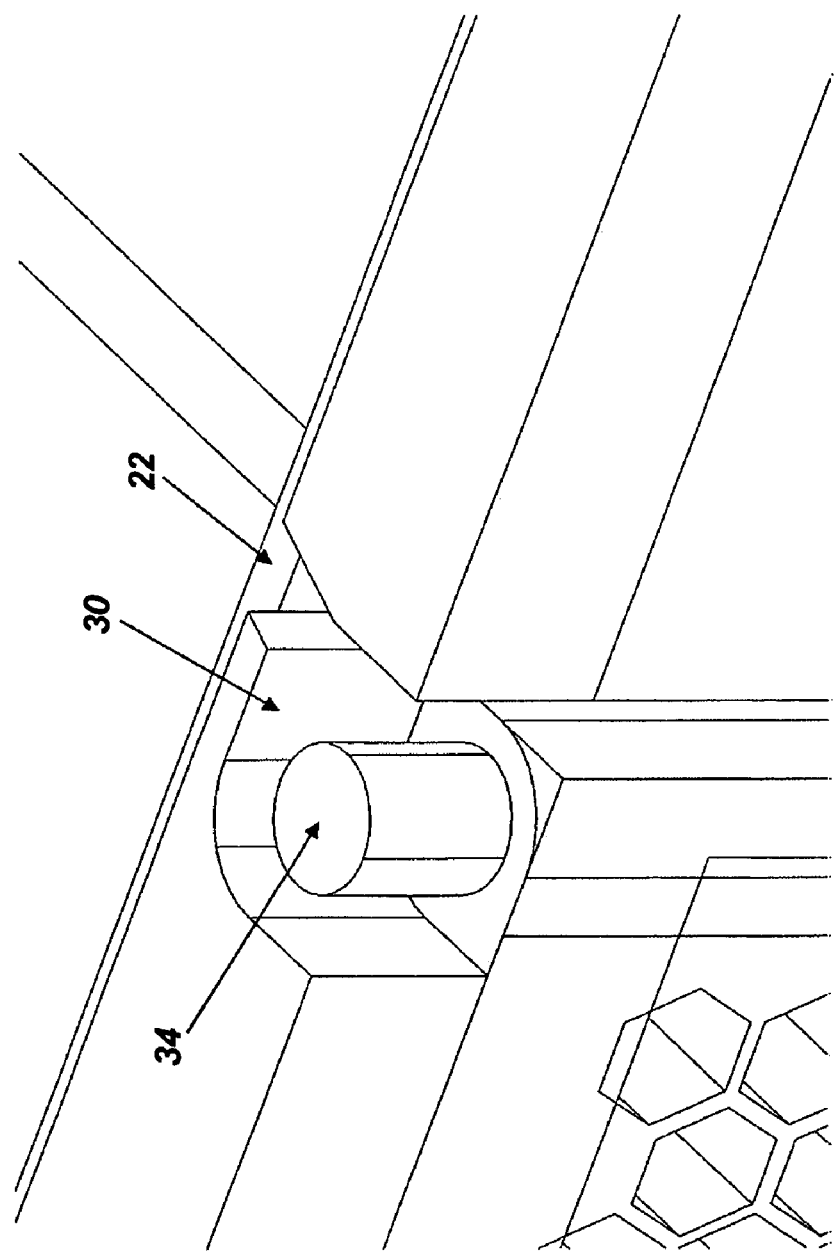
FIG. 6 illustrates a pictorial diagram illustrating closed EMC/RFI seals in accordance with a preferred embodiment.
Figure 8:
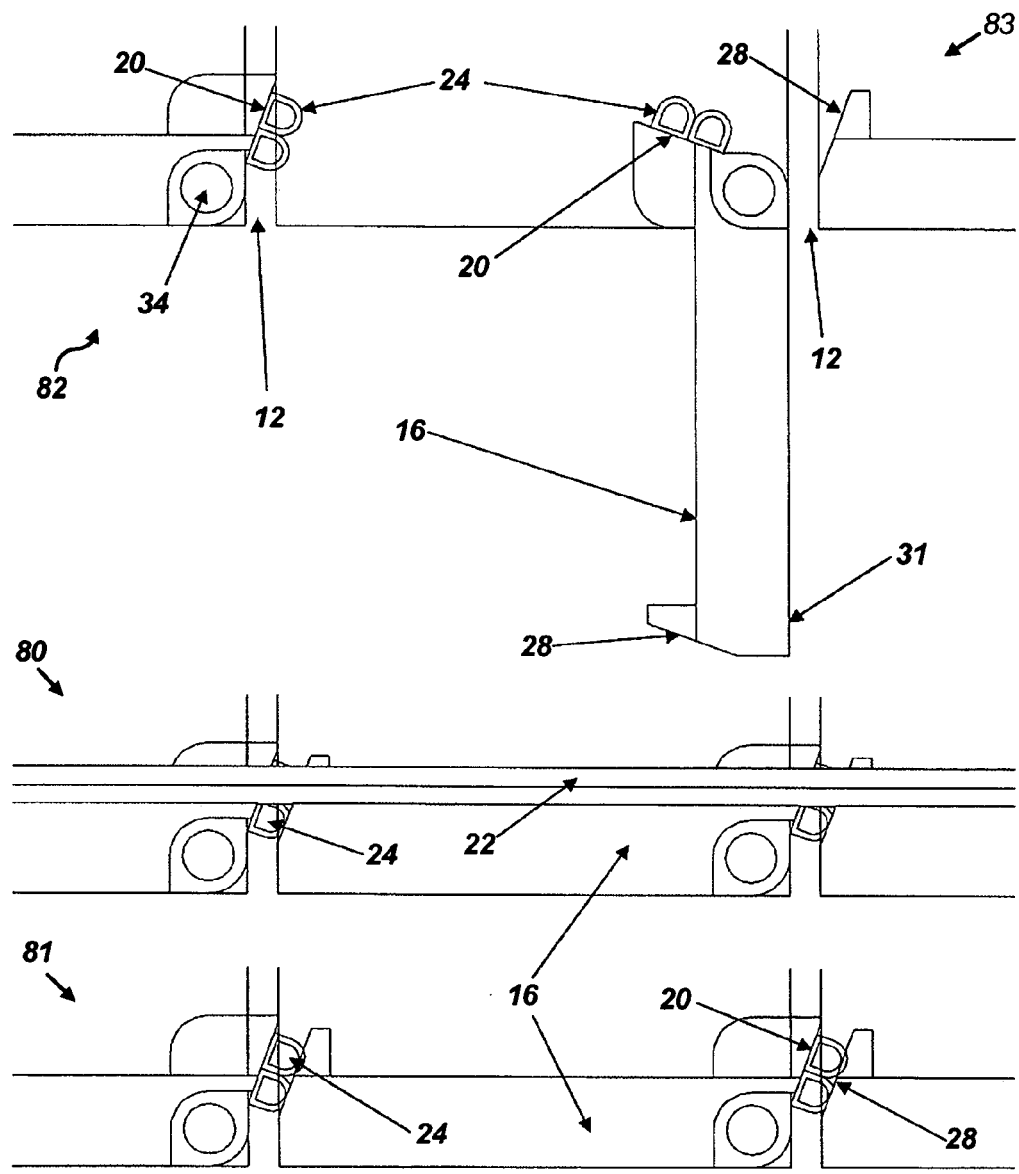
FIG. 8 illustrates a top view of a configuration depicting cam action and compression of EMC/RFI gaskets in accordance with a preferred embodiment.

FIG. 6 illustrates a pictorial diagram illustrating closed EMC/RFI seals in accordance with a preferred embodiment. Each device 25, 26, 27, 29 has a clearance gap surrounding it to allow the devices 25, 26, 27, 29 to be easily extracted or inserted. This clearance gap 12 (e.g., see FIG. 8) contains energy from the electronics inside the device and will become a radiating antenna. Opening and closing the door 16 applies the pressure that seals the gaskets surrounding the door 16. This gasket 22 is of conductive material with low impedance to electrical current.

When closed, the door 16 compresses the gasket against the next device or against the chassis cage 14. This provides a tight conductive seal around each of the devices 25, 26, 27, 29. The gasket 24 is fastened to the attached surface 20 that rotates around the door pivot 34. The attached surface 20 is designed to place the gasket 22 against and slightly behind the door 16 sealing surface 28 of the adjacent device completing the seal that surrounds the door 16. The gasket attaches to surface 20 and the gasket-sealing surface 28 are slightly angled to block a straight-line gap.

FIG. 7 illustrates a pictorial diagram depicting EMC/RFI cage seals in accordance with a preferred embodiment. In FIG. 7, a rear perspective view 70 is depicted, along with a top view 71 of the EMC/RFI cage seals. Electronic item 26, for example, can generate heat as well as EMC/RFI energy. Therefore the door 16 needs to have inlets 10 for ambient air enter the removable portion 36 and, at the same time, are solid enough to block EMC/RFI energy from escaping the removable portion 36. The front surface of the door 16 contains long holes (e.g., inlet 9) for permitting air to enter. Similar features are present for each of the devices 25, 26, 27, 29. For example, door 17 includes a plurality of airflow inlets or holes 10. The length of such holes act as a wave-guides that absorb energy hitting the inter surfaces of the hole. The shape of the hole can be round or rectangular, but hexagon is preferred to maximize the air inlet openings. The dimensions of the hole diameter and the depth determine the effectiveness of the air let 10 versus the EMC/RFI energy emission. Opening and closing the door 16, for example, applies the pressure that seals the gaskets surrounding the door 16.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A self-sealing apparatus for containing electrical energy associated with electrical components, comprising:
   at least one removable device maintained by a housing, wherein said at least one removable device contains electrical components therein and is separated from at least one other removable device by a clearance gap formed therebetween; and
   a self-sealing barrier formed from said clearance gap, wherein said self-sealing barrier comprises a grounding barrier, wherein said clearance gap contains energy from the electrical components inside the device and will become a radiating antenna, wherein said clearance gap surrounds said at least one removable device in order to contain electrical energy associated with said electrical components when said electrical components are maintained within said at least one removable device is extracted or inserted from or into said at least one removable device.

2. The apparatus of claim 1 further comprising a door associated with said at least one removable device, wherein said door comprises a plurality of inlet holes, which allow air to flow therethrough and reduce heating associated with said electrical components.

3. The apparatus of claim 2 further comprising a handle integrated with said at least one removable device, wherein said handle provides a leverage for opening said said door.

4. The apparatus of claim 2 further comprising:
   a first gasket formed horizontally across said housing; and
   a second gasket formed vertically along a pivot edge of said door, such that when said door is closed said door compresses said first and second gaskets against said at least one other removable device or against said housing in order to provide said self-sealing barrier thereof.

5. The apparatus of claim 2 wherein each inlet hole among said plurality of inlet holes comprise a length thereof that functions as wave-guides that absorb said electrical energy coming into contact with an inner surface of each inlet hole.

6. The apparatus of claim 1 wherein said self-sealing barrier comprises a conductive seal formed from a conductive material with a low impedance to electrical current.

7. The apparatus of claim 1 wherein said self-sealing barrier comprises a continuous perimeter grounding seal surrounding said at least one removable device.

8. The apparatus of claim 1 wherein said housing comprises a chassis cage.

9. The apparatus of claim 1 wherein said electrical energy associated with said electrical components comprises EMC energy.

10. The apparatus of claim 1 wherein said electrical energy associated with said electrical components comprises RFI energy.

11. A self-sealing apparatus for containing electrical energy associated with electrical components, comprising:
   at least one removable device maintained by a housing, wherein said at least one removable device contains electrical components therein and is separated from at least one other removable device by a clearance gap formed therebetween;
   a self-sealing grounding barrier formed from said clearance gap, wherein said clearance gap contains energy from the electrical components inside the device and will become a radiating antenna, wherein said clearance gap surrounds said at least one removable device in order to contain electrical energy associated with said electrical components when said electrical components are maintained within said at least one removable device is extracted or inserted from or into said at least one removable device;
   a door associated with said at least one removable device, wherein said door comprises a plurality of inlet holes, which allow air to flow therethrough and reduce heating associated with said electrical components;
   a handle integrated with said at least one removable device, wherein said handle provides leverage for opening said door;
   a first gasket formed horizontally across said housing; and
   a second gasket formed vertically along a pivot edge of said door, such that when said door is closed said door compresses said first and second gaskets against said at least one other removable device or against said housing in order to provide said self-sealing grounding barrier thereof.

12. The apparatus of claim 11 wherein each inlet hole among said plurality of inlet holes comprise a length thereof that functions as wave-guides that absorb said electrical energy coming into contact with an inner surface of each inlet hole.

13. The apparatus of claim 11 wherein said self-sealing grounding barrier further comprises:
   a conductive seal formed from a conductive material with a low impedance to electrical current; and
   a continuous perimeter grounding seal surrounding said at least one removable device.

14. The apparatus of claim 12 wherein said electrical energy associated with said electrical components comprises at least one of the following: EMC energy or RFI energy.

* * * * *